United States Patent
Patapoutian et al.

(10) Patent No.: US 8,156,409 B2
(45) Date of Patent: Apr. 10, 2012

(54) SELECTIVELY APPLIED HYBRID MIN-SUM APPROXIMATION FOR CONSTRAINT NODE UPDATES OF LDPC DECODERS

(75) Inventors: Ara Patapoutian, Hopkinton, MA (US); Rose Y. Shao, Worcester, MA (US); Arvind Sridharan, Longmont, CO (US)

(73) Assignee: Seagate Technology LLC, Cupertino, CA (US)

( * ) Notice: Subject to any disclaimer, the term of this patent is extended or adjusted under 35 U.S.C. 154(b) by 1077 days.

(21) Appl. No.: 12/040,230

(22) Filed: Feb. 29, 2008

(65) Prior Publication Data

US 2009/0222710 A1 Sep. 3, 2009

(51) Int. Cl.
*H03M 13/00* (2006.01)
(52) U.S. Cl. .......... 714/780; 714/774; 375/340
(58) Field of Classification Search .......... 714/774, 714/780; 375/340
See application file for complete search history.

(56) References Cited

U.S. PATENT DOCUMENTS

| | | | |
|---|---|---|---|
| 7,127,659 B2 | 10/2006 | Richardson et al. | |
| 7,174,495 B2 | 2/2007 | Boutillon et al. | |
| 7,191,376 B2 | 3/2007 | Yedidia | |
| 7,197,691 B2 | 3/2007 | Beerel et al. | |
| 7,246,297 B2 | 7/2007 | Zarrinkhat et al. | |
| 7,266,750 B1 | 9/2007 | Patapoutian et al. | |
| 2004/0153938 A1 | 8/2004 | Okamura et al. | |
| 2004/0237025 A1 | 11/2004 | Beerel et al. | |
| 2005/0138516 A1 | 6/2005 | Yedidia | |
| 2005/0138519 A1 | 6/2005 | Boutillon et al. | |
| 2005/0149840 A1 | 7/2005 | Lee et al. | |
| 2005/0204271 A1 | 9/2005 | Sharon et al. | |
| 2005/0210366 A1 | 9/2005 | Machata | |
| 2005/0240647 A1 | 10/2005 | Banihashemi et al. | |
| 2006/0026486 A1 | 2/2006 | Richardson et al. | |
| 2006/0282742 A1 | 12/2006 | Zhang et al. | |
| 2007/0011586 A1* | 1/2007 | Belogolovyi et al. | 714/774 |
| 2007/0168832 A1 | 7/2007 | Richardson et al. | |
| 2007/0168833 A1 | 7/2007 | Lestable et al. | |
| 2007/0245217 A1 | 10/2007 | Valle | |
| 2007/0250759 A1 | 10/2007 | Chakrabartty | |
| 2008/0292025 A1* | 11/2008 | Efimov et al. | 375/340 |
| 2009/0113256 A1* | 4/2009 | Radosavljevic et al. | 714/699 |

* cited by examiner

*Primary Examiner* — Sam Rizk
(74) *Attorney, Agent, or Firm* — Alan G. Rego; Westman, Champlin & Kelly, P.A.

(57) ABSTRACT

In accordance with one or more embodiments, a decoder may determine whether a lowest reliability value of a plurality of codeword bits that correspond to a particular output reliability value for a particular constraint node of a parity-check matrix is greater than a threshold value (e.g., an offset), and if so, selectively applies a modified min-sum approximation constraint node update with a reliability value modification (e.g., an offset or normalized min-sum approximation).

21 Claims, 8 Drawing Sheets

SELECTIVELY APPLIED HYBRID MIN-SUM APPROXIMATION FOR CONSTRAINT NODE UPDATES OF LDPC DECODERS

BACKGROUND

This invention relates generally to decoding, such as low density parity check (LDPC) decoding.

Present day storage systems employ a number of different techniques to eliminate errors that may occur during a data readback process. Every block that is read is decoded "on-the-fly" in a single read attempt, and if unsuccessful, after some number of rereads. If the rereads are unsuccessful, the block is then subject to a data recovery procedure. Typically, the "on-the-fly" decoding and the rereads are performed by a hardware decoder. When a reread operation is performed, the operating conditions are varied slightly, for example, by offsetting a transducer from a center of a track, to obtain a slightly different waveform. The reread operations repeat until the erroneous data are corrected or a predetermined number of reread operations has been performed, at which point the reread process may be terminated and a firmware-implemented data recovery procedure takes over.

It is possible to perform rereads and data recovery procedures to improve performance as long as the throughput of the storage system is not unacceptably degraded. Preferably, for example, a storage system is designed to ensure that reread and data recovery procedures do not slow the throughput by more than a predetermined throughput specification, e.g., 0.5%. Additionally, the system can ensure compliance with a reliability specification, for example, a reliability specification of $10^{-12}$, which specifies that no more than one block out of $10^{12}$ blocks read should fail to return correct data after a prescribed number of rereads and data recovery procedures are exercised. At present there are very clear boundaries between the "on-the-fly", reread, and firmware-implemented data recovery modes. What matters most, however, is that the two fundamental specifications of throughput and reliability, are satisfied.

Iterative decoding is a class of powerful detector/decoder architectures in which the detector provides symbol reliability values to the decoder and the decoder in turn provides reliability values back to the detector. One example of such an iterative system applies the so-called Low Density Parity Check (LDPC) code. When many iterations between the detector and decoder are allowed, it is possible to achieve a significant performance gain (e.g., approximately 3 dBs for 100 iterations) relative to other architectures such as the Reed-Solomon (RS) decoders. Unfortunately, implementing just a single iteration in hardware is a major challenge in terms of hardware complexity, and implementing many more iterations can be extremely costly. On the other hand, when only a few iterations in hardware are allowed, much of the performance improvement is lost, e.g., a 3 dB gain for 100 iterations may be reduced to a single dB when just two iterations are performed.

Containing the complexity and implementation size of an LDPC decoder is a major concern. At present, there exist multiple algorithms that simplify the decoder complexity with small signal-to-noise-ratio (SNR) performance loss. However, these simplifying algorithms degrade a burst erasure capability of the LDPC code/decoder. There remains a need, therefore, for an efficient LDPC decoder that both simplifies the decoder complexity and provides for sufficient burst erasure capability.

SUMMARY

In accordance with one or more embodiments described herein, a decoder may determine whether a lowest reliability value of a plurality of codeword bits that correspond to a particular output reliability value for a particular constraint node of a parity-check matrix is greater than a threshold value (e.g., an offset), and if so, selectively applies a modified min-sum approximation constraint node update with a reliability value modification (e.g., an offset or normalized min-sum approximation).

Also, in accordance with one or more embodiments described herein, a decoding mode may be determined during decoding, such that the decoder may selectively apply at each constraint node one of either a modified min-sum approximation constraint node update with a reliability value modification or an unmodified min-sum approximation constraint node update without a reliability value modification based on the decoding mode.

BRIEF DESCRIPTION OF THE DRAWINGS

The embodiments described herein may be better understood by referring to the following description in conjunction with the accompanying drawings in which like reference numerals indicate identically or functionally similar elements, of which:

FIGS. 4-5B are depictions of a Low Density Parity Check (LDPC) decoder architecture.

DETAILED DESCRIPTION OF AN ILLUSTRATIVE EMBODIMENT

Figure 1:
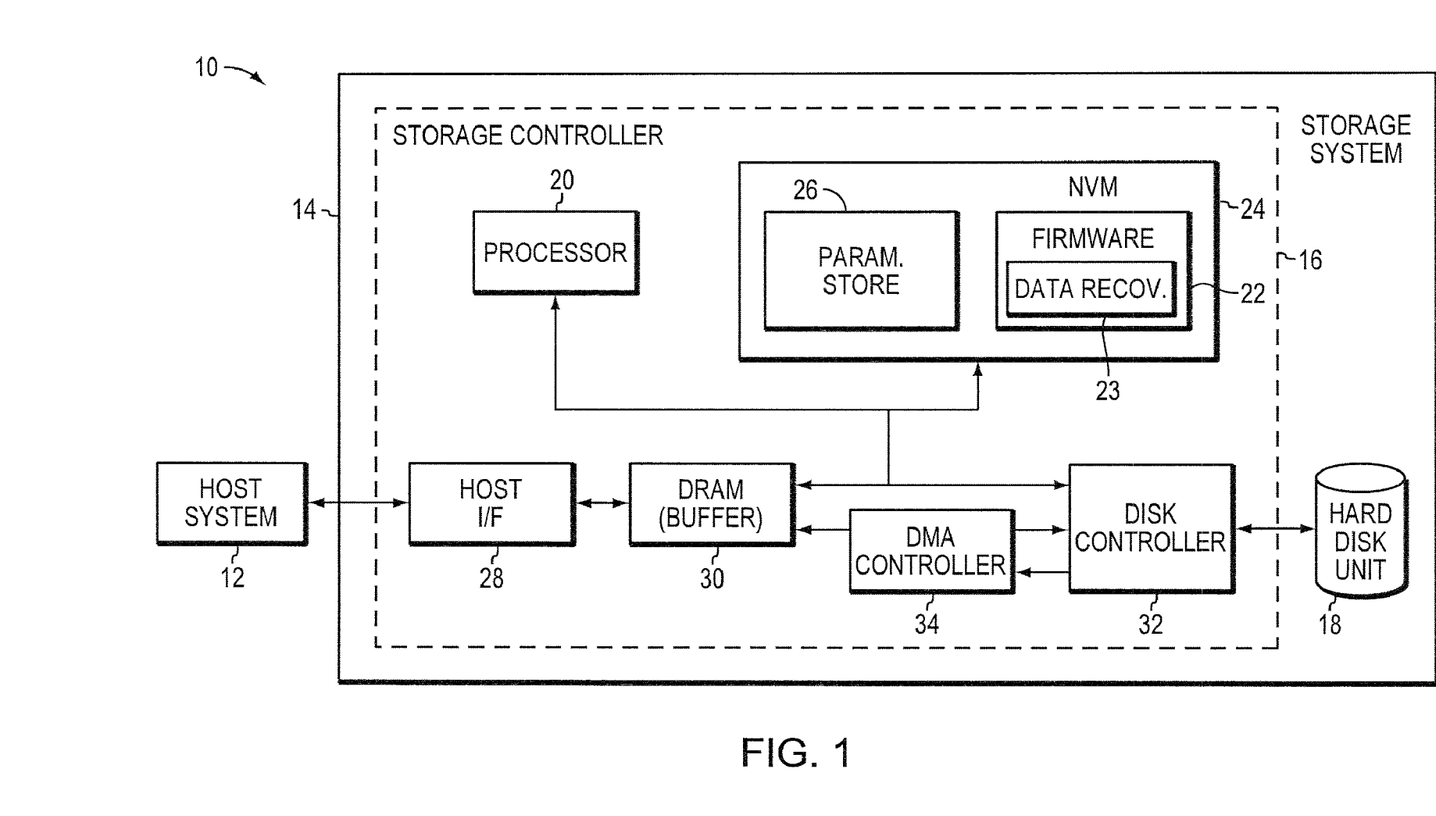
FIG. 1 is a block diagram of a data processing system including a storage system.

Referring to FIG. 1, an exemplary data processing system 10 is shown. The data processing system 10 may comprise a host system or computer 12 coupled to a storage system 14, e.g., a disk drive. The storage system 14 includes a storage controller 16 coupled to a storage device, shown as a hard disk unit 18. The hard disk unit 18 is intended to represent a head disk assembly (HDA) as well as spindle, motor, actuator, and other conventional drive components not included in the storage controller 16.

In an illustrative embodiment, the storage controller 16 may be implemented as an intelligent storage controller. Thus, the storage controller 16 may include a processor 20 and firmware 22 to control the overall operations of the storage system 14. The storage controller 16 further includes a memory (shown as a nonvolatile memory, "NVM") 24, which stores a copy of the firmware 22 and any required parameter data in a parameter store 26, and is read each time the storage system 14 boots. The firmware 22 may be copied to a volatile memory, for example, a RAM located in the processor 20 or elsewhere in the storage system, at initialization for subsequent execution by the processor 20. The firmware 22 includes routines required to handle host commands, as well as other routines, for example, a data recovery procedure 23.

The storage controller 16 also includes a host interface 28 that interfaces the storage controller 16 to the host system 12, and a data buffer 30 (e.g., DRAM, as shown), which buffers data being transferred between the host computer 12 and the hard disk unit 18 as well as stores commands provided by the host computer 12 to the storage controller 16.

The host system 12 writes commands and data to the data buffer 30, and reads status and data from the data buffer 30. Commands sent from the host system 12 can be higher-level commands, such as reading a file by name. The processor 20 executes the firmware 22 to translate host commands from the host system 12 into more detailed command sequences required by the disk controller 32 to implement the command.

The storage controller 16 also includes a disk controller 32, which is operatively coupled to the hard disk unit 18 as well as the processor 20 and data buffer 30. The disk controller 32 performs a variety of drive control functions. For example, it provides the motor control and control signals to enable the HDA.

In one implementation of the storage controller 16, as shown in FIG. 1, the storage controller 16 employs a DMA controller 34 to optimize data transfer operations. The DMA controller 34, which is coupled to the disk controller 32 and the data buffer 30, is used by the disk controller 32 to transfer data from the hard disk unit 18 to the data buffer 30.

Figure 2:
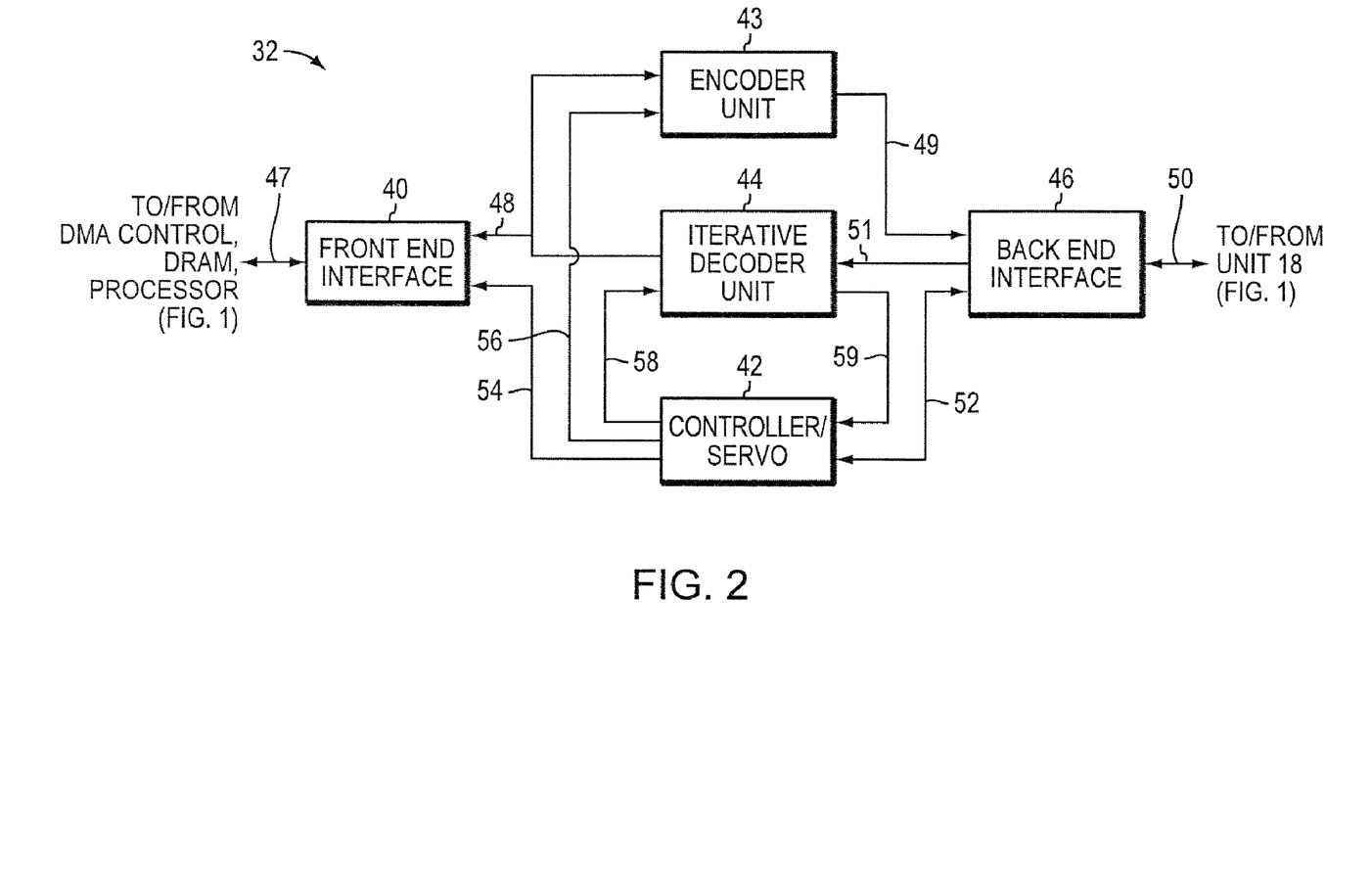
FIG. 2 is a block diagram of a disk controller in the storage system of FIG. 1.

Referring to FIG. 2, an exemplary embodiment of the disk controller 32 includes a front end interface 40, a controller/servo unit 42, an encoder unit 43, a decoder unit 44, and a back end interface 46. Data to be written to the hard disk unit 18 is provided over bus 47 to the front end interface 40, which provides the data to the encoder 43 via bus 48. The encoder unit 43 encodes the data and provides the encoded data to the back end interface 46 over bus 49. The back end interface 46, which includes the read channel, provides the encoded data to the hard disk unit 18 over an output bus 50. During a read back operation, the back end interface 46 transfers the encoded read data from the hard disk unit 18 to the decoder unit 44 over a bus 51. The decoder unit 44 provides decoded data to the bus 48 for transfer to the host system (via the DMA controller 34, data buffer 30, and host interface 28 of FIG. 1).

It will be appreciated that the embodiment shown in FIG. 2 is merely intended to illustrate a functional partitioning of the disk controller 32. The physical implementation of the disk controller functionality is a matter of design choice and thus can take any number of different forms. That is to say, the illustrated functional units need not be implemented separately, and various functional units, e.g., the controller 42, may be implemented with one or more integrated circuits.

The controller/servo unit 42 includes read/write control and servo logic, and thus provides the appropriate disk control signals 52 to supervise the recording of data on and retrieval of data from one or more disks in the hard disk unit 18. It also provides one or more front end interface control signals 54 to control operation of the front end control 40, as well as provides control signals to encoder and decoder units. The controller 42 thus provides encoder control signals 56 that direct the encoder unit 43 to encode data written to the hard disk unit 18 and provides decoder control signals 58 that direct the decoder unit 44 to decode the coded data as it is read back from a disk in the hard disk unit 18. The decoder unit 44 provides decoder output control signals 59 to the controller 42 to convey status of decoding operations, as will be described.

The exemplary storage system 14 as thus described with reference to FIGS. 1 and 2 is intended to illustrate only those aspects of the storage system 14 which pertain to iterative decoding within the context of data reads. Hence, some functions are omitted and others simplified to a level appropriate to a discussion of the iterative decoding process as follows.

The error correcting code employed by the disk controller 32 is a single level iteratively decodable code, such as a Low Density Parity Check Code (LDPC), product code or the like. More particularly, the decoder unit 44 is an iterative decoder unit and is therefore configured to perform an iterative decoding algorithm, as will be discussed in further detail below.

Referring back to FIGS. 2 and 3, like conventional decoding architectures, the storage controller 16 supports an "on-the-fly" decoding, that is, decoding which occurs in hardware in the stream of an initial read attempt, and a firmware-implemented data recovery procedure. Hardware-based rereads may also be supported. The iterative decoding unit 44 is utilized for the hardware decoding and the data recovery process 23 utilizes firmware 22 (shown in FIG. 2) for data recovery procedures.

A goal of the architecture of disk controller 32 is to minimize the probability of going to the firmware data recovery mode when the hardware-implemented "on-the-fly" decoding iterations are few (e.g., 2). This goal is achieved by controlling the decoder hardware, that is, decoder unit 44, to perform additional iterations. Illustratively, the disk controller 32 may use an "on-the-fly" hardware decoding mode and an "extended" hardware decoding mode, both having the same redundancy level but using a different number of iterations. For example, for an extended hardware decoding mode of operation, the controller 42 (of the disk controller 32) may control the decoder unit 44 to perform more iterations at times when the decoder unit 44 would otherwise be idle. The "on-the-fly" hardware decoding may include a predetermined number of iterations. If necessary, when the block fails to converge to correct data within the predetermined number of iterations, the decoder unit 44 may be used in the extended hardware decoding mode to perform additional iterations. A desired throughput specification, e.g. $10^{-6}$, is satisfied by the 'on-the-fly' hardware decoding with a fixed number of iterations, together with the extended hardware decoding with a variable number of iterations dependent upon the time and buffer space permitted. The reliability specification, e.g., a block failure rate of $10^{-12}$, is satisfied by the firmware data recovery decoding (and rereads if performed).

Figure 3:
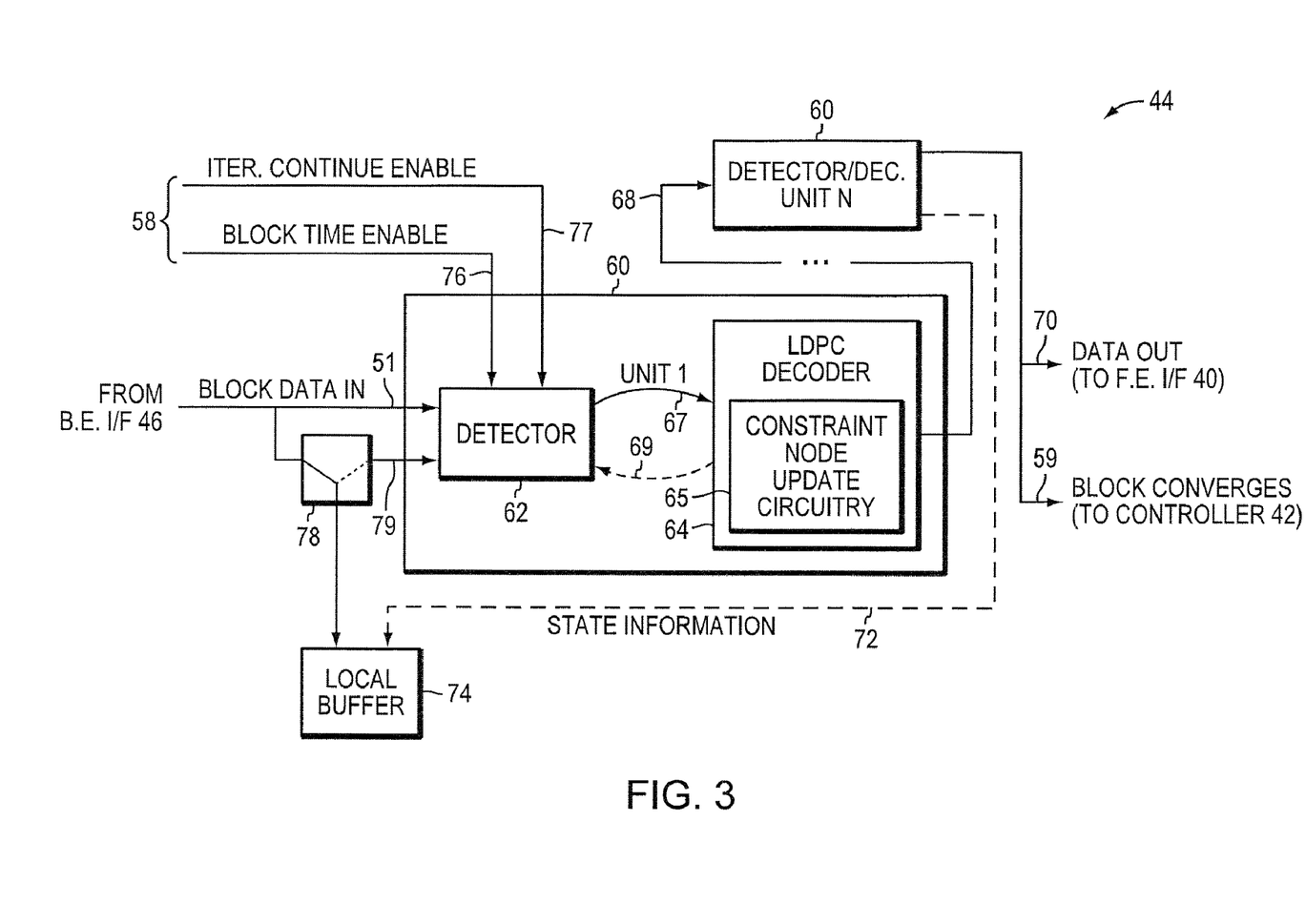
FIG. 3 is a block diagram of one exemplary embodiment of an iterative decoder unit controlled by the disk controller of FIG. 2 to perform hardware "on-the-fly" and data recovery decoding iterations in accordance with the present invention.

Referring to FIG. 3, in one exemplary embodiment, the decoder unit 44 includes "N" units 60 connected in a cascaded fashion, one of which is shown in the drawing. Each unit 60 includes a soft output detector 62 coupled to a decoder shown as a LDPC decoder 64. The use of a LDPC decoder to illustrate embodiments of the invention is chosen as a matter of convenience, as an example likely to be familiar to those skilled in the art. The concepts disclosed and explained herein are equally applicable to any iterative decoding technique, as mentioned earlier.

The detector 62 receives a block from the disk unit 18 via the back end interface 46 as a first input over bus 51. Collectively, the disk unit 18 and the back end interface 46 may be referred to generally as the data channel. The detector 62 generates from the block probabilistic (soft) information 67, which it passes to the LDPC decoder 64. As a multi-stage unit, the LDPC decoder results 68 of the current stage (current iteration) are passed to the detector 62 in the next stage 60 for the next iteration. Alternatively, in a single stage unit operating at a faster clock rate to run N iterations in a single block time, the LDPC results are passed to the detector in that same stage, via feedback 69 (shown in dotted lines in the figure). Other implementations which incorporate aspects of both single stage and multi-stage unit can be used as well.

Thus, the detector 62 and LDPC decoder 64 will update each other multiple times until the decoding process either converges to the correct data or the "on-the-fly" processing of the block time terminates. Collectively, the units 60 perform, in an on-the-fly hardware decoding mode, "N" decoding iterations for a predetermined block time. It should be noted that the number of iterations (between detector 62 and decoder 64) need not necessarily be an integer. Furthermore, the decoder 64 itself may be iterated some number of times which, like N, need not be an integer.

The encoder unit 43 (FIG. 2) receives input bits of a block, encodes them according to LDPC code construction, which may be a generator matrix based on the parity-check matrix, and provides as output the n-bit coded block or codeword "x", which is then transmitted to the data channel. The block "x" as read from the channel, referred to as block "x'", may be corrupted as a result of some channel disturbance or noise, such as signal-dependent transition noise (e.g., position jitter), or inter-symbol interference (ISI). Thus, the decoding process of the decoder 44 operates to estimate, from an erroneous coded block "x'" received during a read back operation, the coded block "x" that was provided to the channel during recording. The decoding process is iterated multiple times to improve the decoding reliability, and bit decisions are made in the final, successful iteration.

As is known in the art, an LDPC code is defined by a large, very sparse, non-systematic, parity-check matrix. As an example, a regular LDPC or Gallager code can be denoted as an (n, j, k) LDPC code and is defined by a parity-check matrix of "m" rows and "n" columns, with "j" ones in every column, "k" ones in every row, and zeros everywhere else. The parity-check matrix completely describes the code by requiring valid codewords to satisfy the expression "H*x=h" where "H" is the parity-check matrix, "x" is an n by 1 codeword, and the vector "h" is a syndrome vector having zero-one syndrome entries (or parity constraints) corresponding to whether even or odd parity is imposed by each parity check equation of the "H*x=h" expression. Usually h is the all zero vector. Each column of the parity-check matrix corresponds to a particular transmitted bit of x, and each row corresponds to a particular checksum. For each LDPC iteration, all of the rows of the parity-check matrix of the LDPC code are processed. For an LDPC decoder implementation, any LDPC decoding procedure, for example, those originally described by Robert G. Gallager in his book "Low-Density Parity-Check Codes," The M.I.T. Press, 1963, or those described by J. Hagenauer, E. Elke and L. Papke, in "Iterative decoding of binary block and convolutional codes", IEEE Trans. Info. Theory, Vol. 42, No. 2, March 1996, or in U.S. Patent Application No. US2003/0033575A1, entitled "Method and Apparatus for Decoding LDPC Codes", in the names of T. Richardson and V. Novichkov, can be used.

In one embodiment, the detector 62 may be configured to perform the well-known "BCJR" algorithm (also referred to as the "forward-backward" algorithm). Details of the BCJR algorithm can be had with reference to a paper by L. R. Bahl, J. Cocke, F. Jelinek and J. Raviv, entitled "Optimal Decoding of Linear Codes for Minimizing Symbol Error Rate," IEEE Trans. Info. Theory, Vol. 20, pp. 248-87, March 1974, which is incorporated herein by reference. The BCJR algorithm provides the a posteriori probabilities (APP) of the coded bits sent through the channel, which in turn can be used as soft information. Of course, other types of soft output detectors can be used as well.

Still referring to FIG. 3, once the N iterations have been performed, the LDPC decoder 64 (in the last detector/decoder stage 60, if multiple stages are used) provides via control signal 59 an indication if the iterative decoding converged on the correct data. If it did, the LDPC decoder 64 provides the decoded block data over a data output bus 70. Otherwise, if the signal 59 indicates that further iterations are needed, the LDPC decoder 64 is directed to store state information (data in) 72 describing the state of the iterative decoding in a local buffer 74. Alternatively, or in addition, the decoder unit 44 may save a copy of the block (block data in 51) in the local buffer 74 when it is received.

The controller 42 signals the beginning of the block time (N "on-the-fly" decoding iterations) via a block time enable 76. It uses a second enable, shown as "Iteration Continue Enable" 77, to signal that additional iterations are to begin. At the same time, the controller 42 provides either buffered state information or block data, or both, to the detector 62 (of the first unit or stage 60, if more than one stage is used). The decoding unit 44 then uses this information to either resume decoding iterations where the on-the-fly mode left off (at iteration N+1), or start from scratch (beginning with a first iteration). A switch 78 may be used to connect the local buffer 74 to the first input 51 or a second input 79, depending on whether data is being stored in the buffer 74 (in which case the first input 51 is selected) or being retrieved for further decoding iterations (in which case the second input 79 is selected).

The incoming data received on first input 51 may be buffered in another buffer (not shown) as it is received from the back end interface 46. In another implementation, the first input 51 could be coupled to two buffers, with one buffer storing the incoming block data and the other buffer maintaining a copy of block data that requires further iterations, and select the appropriate buffer (for example, using a switch like switch 78).

In essence, therefore, the controller 42 operates to enable the extended hardware decoding mode by re-using the decoding unit hardware to perform more iterations than are allowed during a given block time during the "on-the-fly" hardware decoding mode.

The local buffer 74 may be a dedicated buffer that stores "M" blocks. When the required number of buffers becomes large, however, this approach may become expensive. Thus, it may be desirable to keep M very small (e.g., M=3) and instead use the drive buffer memory (e.g., DRAM 30) to store the block data awaiting further decoding iterations.

The additional iterations are allowed to occur when the storage system is busy with overhead-related activities, such as seeks, head switches and reads of track and sector control information, and thus at times when the decoder unit 44 would otherwise be idle, so that throughput is not degraded.

Details of the LDPC decoding will now be described. As is well understood in the art, the LDPC decoding can be viewed as a message passing on a bipartite graph representation of the parity-check matrix. A specific LDPC code can be modeled using a bipartite graph that consists of bit nodes (corresponding to the bits of the codeword x), and check nodes (corresponding to the parity checks), with an edge between a bit node and a check node for each corresponding "1" entry in the parity-check matrix.

One common method for decoding LDPC codes is the so-called "sum-product" (SPA) algorithm. In this algorithm, information is exchanged iteratively between the bit and check nodes of the bipartite graph. Each decoding iteration by the LDPC decoder is performed in the following manner. The LDPC decoder begins with soft information for the bits $x_i$ (where $0 \leq i \leq n-1$) obtained from the detector 54. During each iteration, the LDPC decoder updates messages passing from bit nodes to check nodes and messages passing from check nodes to bit nodes. At the end of one iteration, soft information for each coded bit is updated. Decoding iterations continue in this manner until a valid codeword has been reached (that is, H*x=0, for even parity), for a predetermined block time, or until some other condition (buffer overflow) occurs, as discussed above.

Typical decoder implementations require sequential or pipelines operations, and are thus quite demanding in terms of hardware complexity and speed. In conventional LDPC decoders, a single iteration of the LDPC decoder independently updates all of the parity constraints. For example, an LDPC with 500 rows of parity matrix H would be updated when all 500 parity constraints are updated independently, and then all the 500 updated outputs are merged. This type of update operation or scheduling scheme is referred to herein as a "parallel update". Accordingly, an LDPC decoder such as the LDPC decoder 54 may be operated to perform parallel updates according to known techniques.

Figure 4:
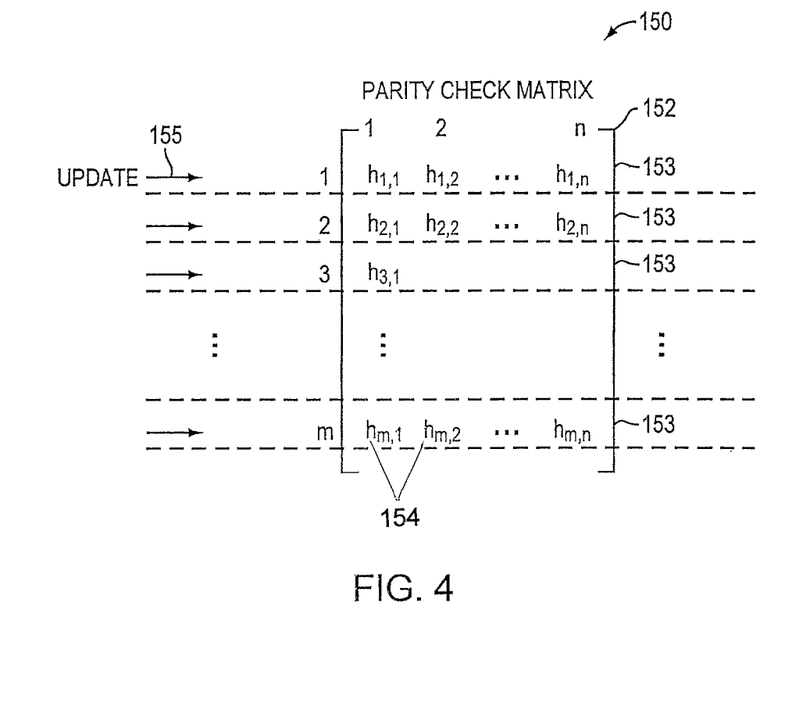
Figure 5A:
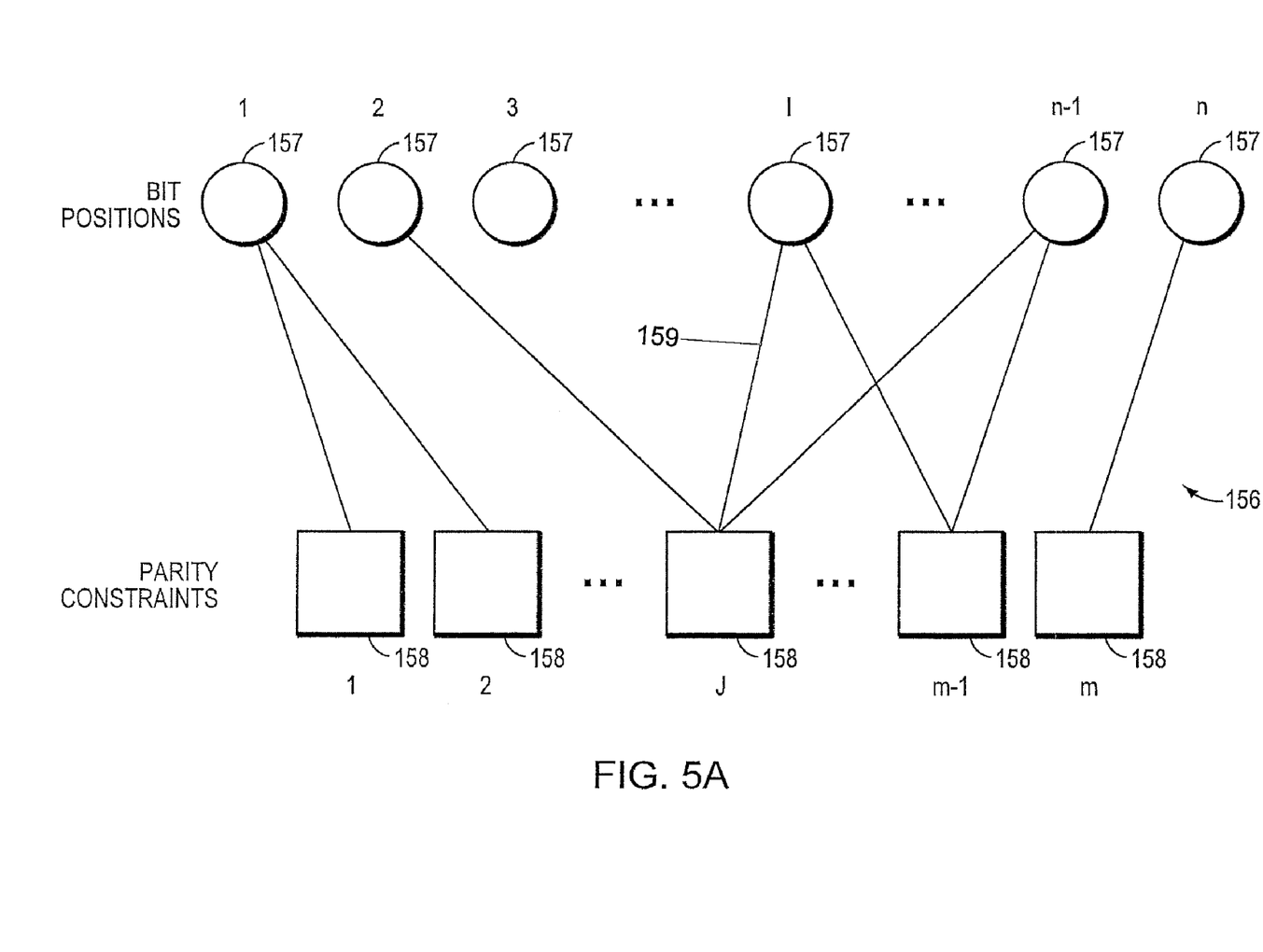
Figure 5B:
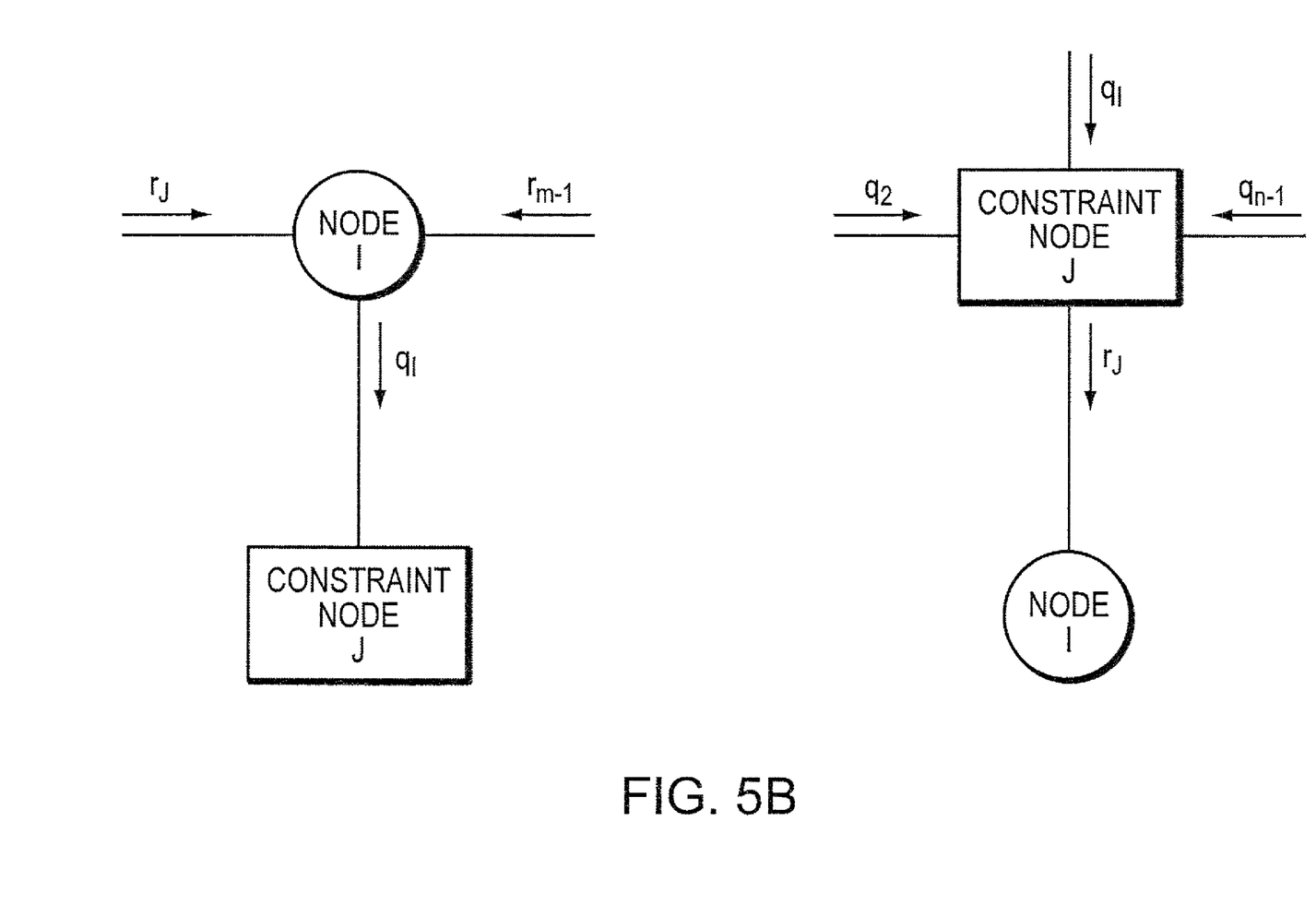

FIGS. 4-5B illustrate an example LDPC iteration processing 150. FIG. 4 shows the processing 150 with respect to a parity check matrix H 152. The parity check matrix 152 is an "m" by "n" parity-matrix of "m" rows 153 by "n" columns. The rows correspond to parity constraints, and each row element 154 corresponds to a bit position of an n-bit codeword "x". In the figure, arrows 155 are used to indicate "m" parallel updates, however, other updates, e.g., sequential, may be used, such as those described in commonly-owned copending U.S. patent application Ser. No. 10/454,326, entitled ERROR RECOVERY STRATEGIES FOR ITERATIVE DECODERS, filed by Patapoutian et al., on Jun. 4, 2003, now issued as U.S. Pat. No. 7,266,750 on Sep. 4, 2007, the contents of which are hereby incorporated by reference in its entirety.

Processing details of an iteration and a single update within an iteration can best be understood with reference to FIG. 5A, which shows a message passing graph 156 formed from the H matrix. In the message passing graph 156 (a bipartite graph), upper nodes (variable or bit nodes "q") 157 represent the codeword bit positions and lower nodes (check or constraint nodes "r") 158 represent the parity constraints. Variable node "I" is connected to constraint node "J" by an edge 159 if the Ith position in the Jth row is a '1', that is, if H(J,I)=1. Thus, for the example shown, the Jth row of matrix H would have a '1' in the row elements corresponding to positions I, 2 and n–1.

An iterative decoding process can be viewed as transmitting soft information (reliability values) on edges 159, on both directions, on the graph 156. For example, as shown in FIG. 5B, the information transferred from bit node I to constraint node J is $q_J$, which is a function of the incoming information $r_J$, and $r_{m-1}$ from edges other than the one considered. Similarly, the information transferred from constraint node J to bit node I is $r_J$, which is a function of the incoming information $q_2$, $q_I$ and $q_{n-1}$ from edges other than the one considered. A parallel scheduling scheme operates to process all of 'r's and the 'q's of the edges independently (and, preferably, simultaneously).

To begin, the values of the 'q's are set to initial probabilities based on the soft information (reliability values) received from the detector. The 'r's are then computed in parallel using the values of q. Once the 'r's have been computed, it is possible to update the 'q's. Between iterations the values of q can be checked to see if a valid codeword has been determined. Note that, as will be understood by those skilled in the art, sign information (that is, whether the reliability information refers to a "1" or "0") may be processed by decoder 44 separately, e.g., through XORing the signs received on corresponding edges for a particular update.

As noted above, containing the complexity and implementation size of an LDPC decoder is a major concern. At present, there exist multiple algorithms that simplify the decoder complexity with small signal-to-noise-ratio (SNR) performance loss. However, these simplifying algorithms degrade a burst erasure capability of the LDPC code/decoder. In particular, a significant portion of the LDPC decoder is generally dedicated to implementing what is called a "constraint node update" (e.g., depicted above as the right side portion of FIG. 5B, for instance, one half of a sum-product algorithm). A constraint node, with input reliability values of $\{x_i\}$, and an output reliability value of y, has the following relationship:

$$\log(\tanh(y/2)) = \sum_i \log(\tanh(x_i/2)). \qquad \text{EQ 1}$$

In order to simplify the complexity of such a function, it is sometimes used in the industry to use instead:

$$y = \min_i \{x_i\}, \qquad \text{EQ2}$$

which is known as the min-sum approximation (rule), where an output reliability is a weakest link (a lowest input edge). This min-sum algorithm overstates the output reliability value y (that is, generates a higher value than that of EQ1), and therefore there is a non-negligible decoder performance loss associated with this simplification. (As used herein, the min-sum approximation constraint node update without modification to the minimum reliability value is referred to as an "unmodified min-sum approximation.")

In order to improve the performance of the min-sum rule, without increasing the complexity of the LDPC decoder, the constraint node min-sum rule can be modified in one of two known manners. First, in a conventional normalized min-sum approach, $$y = \alpha \min_i \{x_i\}, \qquad \text{EQ3}$$

where $0 < \alpha < 1$ is an attenuation constant that may be used to scale (e.g., reduce) the minimum input reliability value $x_i$. Similarly, in a conventional offset min-sum approach, $$y = \max(\min_i \{x_i\} - c, 0), \qquad \text{EQ4}$$

where $c > 0$ is an offset constant that may be used to remove the bias (again, reduce) of the minimum input reliability value, down to a minimum value, here 0.

The advantage of both of these schemes (normalized min-sum and offset min-sum) is performance improvement with respect to the min-sum algorithm (EQ2) and significant cost savings as compared to the implementation in EQ1. Unfortunately, this is at the expense of the burst erasure capability, where an erasure has no or "0" reliability. In other words, these modifications to the min-sum rule that improve the decoder performance also degrade the burst erasure capability of the decoder. (As used herein, the offset and/or normalized min-sum approximation constraint node updates with modification to the minimum reliability value are collectively referred to as a "modified min-sum approximation.")

Specifically, a vast majority of hardware implementations of an LDPC decoder assume a fixed point representation of the reliability information. Let M denote the smallest (non-zero) reliability that a bit can take. For example, an illustrative embodiment of the present invention may employ a three-bit bus that represents the reliability of a bit (without the sign information). In binary representation, the smallest non-zero value is M=001. Furthermore, an illustrative offset value is c=001. Therefore, if the smallest reliability value entering the constraint node is M=001, then the output of the constraint node becomes:

$$M-c=001-001=000.$$

Similarly, when using the normalized min-sum approach, assume that an illustrative attenuation value is $\alpha=0.9$, and that M=001 (those skilled in the art will appreciate different attenuation values and their use with various reliability value ranges). If the decoder is configured to round down or truncate any fractions, then the output of the constraint node becomes:

$$\alpha M=0.9(001)=0.9, \text{rounded down (truncated)}=000.$$

In both instances above, for both offset min-sum and normalized min-sum approximations, the output reliability information is reduced to zero, and the sign information associated with the reliability information (that is, whether the reliability information corresponds to a particular bit being a "1" or "0") is lost, as there is no reliability in the sign. In other words, the offset/normalized min-sum approximations may create erasures (unreliable bits) when applied to low input reliability values. There remains a need, therefore, for an efficient LDPC decoder that both simplifies the decoder complexity (such as the offset/min-sum approximations) and provides for sufficient burst erasure capability.

The present invention provides techniques for an efficient LDPC decoder that both simplify the decoder complexity and provide for sufficient burst erasure capability. In particular, the present invention applies a "hybrid" min-sum approximation to prevent loss of sign (declared erasures) for low reliability input values. For instance, one or more embodiments described herein provide for a constraint node update implementation that has improved SNR performance as compared to a conventional (unmodified) min-sum approximation, reduced implementation complexity similar to normalized/offset (modified) min-sum approximations, and improved erasure burst detection/correction capability as compared to the normalized/offset (modified) min-sum implementations. Further, one or more additional embodiments advantageously provide an option of using the hybrid min-sum approximation during error recovery mode (optimized for detection/correction of erasure bursts), while using the modified min-sum approximation in a normal read (e.g., "on-the-fly") mode (optimized for detection/correction of random/dispersed errors).

Illustratively, the techniques described herein in accordance with the present invention may be performed by a decoder unit 44, such as within an LDPC decoder 64. More specifically, constraint node update circuitry 65 (referring again to FIG. 3) of the decoder may be configured to perform the novel techniques as hardware, software, firmware, or any combination thereof. In addition, for embodiments described below, the decoder 64 and, thus the update circuitry 65, may be configured to operate in one of a plurality of decoding modes (e.g., a normal read mode and an error recovery mode, as described herein).

Operationally, the present invention utilizes a hybrid min-sum approximation technique where the decoder 64 determines whether to selectively apply a modified min-sum approximation based on whether or not a lowest reliability value of a plurality of inputs that correspond to a particular output reliability value for a particular constraint node of a parity-check matrix is greater than a predetermined/configured threshold value. (That is, whether an unmodified min-sum approximation results in a value that is greater than the threshold value.)

The predetermined/configured threshold value may be determined based on whether the modified min-sum approximation is an offset min-sum approximation or a normalized min-sum approximation. For instance, for an offset min-sum approximation, the threshold value may be equal to the corresponding offset value (e.g., 001, a single unit measure of reliability value). Accordingly, the decoder 64 may perform the offset (modified) min-sum approximation constraint node update by setting the corresponding output reliability value as the lowest input reliability value less the offset value (as in EQ4 above). Conversely, for a normalized min-sum approximation, the threshold value may be a lowest value that when multiplied by the attenuation value ($\alpha$) does not result in the output reliability value being rounded to zero (which is referred to herein as a "normalization threshold value"). For example, if $\alpha=0.9$ as above, the threshold value may be binary 010 (decimal 2), such that 0.9(2) is 1.8, truncated is 1 (001). Accordingly, the decoder 64 may perform the normalized min-sum approximation constraint node update by setting the output reliability value as the lowest input reliability value multiplied by the attenuation value (as in EQ3 above).

In accordance with the present invention, however, if the lowest input reliability value is less than or equal to the threshold value, the decoder 64 uses the unmodified min-sum approximation by setting the output reliability value as the lowest input reliability value. That is, if a modified (offset/normalized) min-sum approximation will result in zero reliability, then a min-sum approximation is used without a modification to the lowest input reliability value (as in EQ2 above). In this manner, by selectively utilizing the modified and unmodified min-sum approximations, the novel hybrid technique prevents the modified min-sum approximation from losing associated sign information for the output reliability value (i.e., prevents declared erasures that aren't already erasures). (Note that the sign of the output reliability value may be processed, e.g., separately from reliability value, based on signs associated with the input reliability values, as may be appreciated by those skilled in the art.)

Specifically, the above algorithm advantageously dictates that if the smallest reliability value entering a constraint node is less than or equal to the threshold (e.g., the offset value or normalization threshold value), then the output of the constraint node remains as the smallest reliability value, rather than being made equal to zero and losing the associated sign. For instance, to prevent losing sign information, the present invention may implement the following hybrid min-sum approximation:

i) Calculate $y=\min_i\{x_i\}$ (EQ2)

ii) If y>threshold, then a) $y=\alpha\min_i\{x_i\}$ (EQ3)

OR b) $y=\max(\min_i\{x_i\}-c,0)$ (EQ4). EQ5

In other words, the reliability value at the output may be modified according to a particular modified min-sum approximation (e.g., offset and/or normalized), but never reduced to zero. (Notably, if the unmodified min-sum approximation results in a zero, then the output value from the constraint node update is also zero.) By using the techniques above, the burst erasure capabilities of a 1 K-byte code may illustratively be increased from 650 bits (as will be understood by those skilled in the art) to 690 bits, and those of a 512-byte code may be increased from 512 bits to 546 bits.

Figure 6:
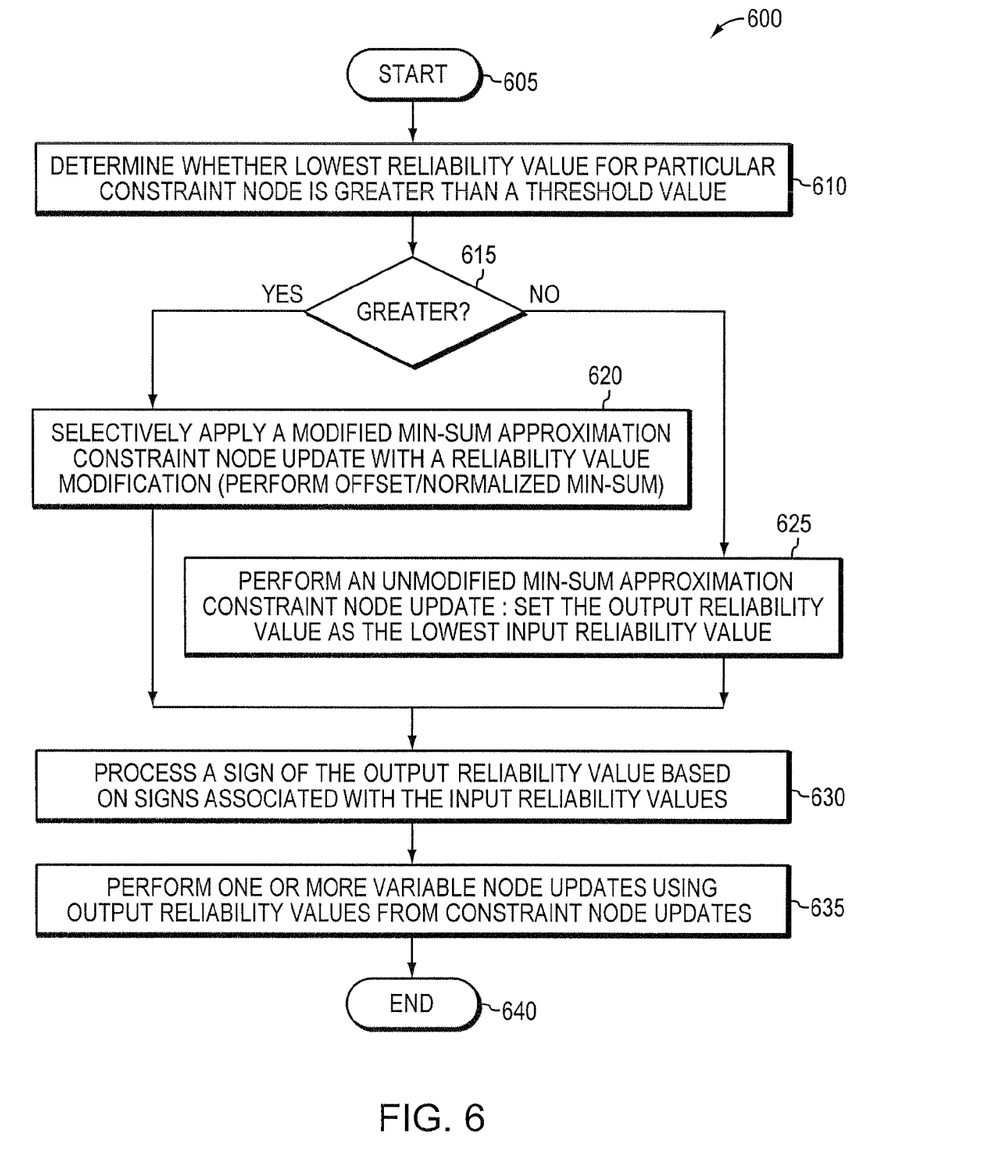
FIGS. 6 and 7 illustrate example procedures that provides for an efficient constraint node update for an LDPC decoder that both simplifies the decoder complexity and provides for sufficient burst erasure capability in accordance with one or more embodiments of the present invention.

FIG. 6 illustrates an example procedure that provides for an efficient constraint node update for an LDPC decoder that both simplifies the decoder complexity and provides for sufficient burst erasure capability in accordance with one or more embodiments of the present invention. The procedure 600 starts at step 605, and continues to step 610, where it is determined whether the lowest reliability value (input from variable nodes) for a particular constraint node is greater than a threshold value, such as an offset value or a normalization threshold value, as described above. If in step 615 the lowest reliability value is greater than the threshold, then in step 620 the decoder 64 (constraint node update circuitry 65) may selectively apply a modified min-sum approximation constraint node update with a reliability value modification (e.g., as described above, may perform an offset/normalized min-sum approximation). If, on the other hand, the lowest reliability value is not greater than the threshold in step 615, then in step 625 the decoder 64 may perform an unmodified min-sum approximation constraint node update, that is, may set the output reliability value as the lowest input reliability value. In this manner, the novel techniques may perform an offset/normalized min-sum approximation, but may thus prevent the modified min-sum approximation constraint node update from losing associated sign information for the output reliability value by selectively applying the unmodified min-sum approximation should the modified approximation result in zero ("0") reliability (i.e., a declared erasure).

In addition, in step 630, the sign of the resultant output reliability value may be processed separately by the decoder 64 based on signs associated with the input reliability values, such as mentioned above. Further, in step 635, in accordance with conventional LDPC decoding, the decoder 64 may perform one or more variable node updates using the output reliability values from the constraint node updates from steps 620 or 625 above. The procedure 600 ends in step 640, notably with the possibility of repeating a number of times for each constraint node update of the LDPC decoding, and/or for each decoding iteration performed by the decoder 64, as mentioned above.

Further, in accordance with one or more embodiments of the present invention, the hybrid min-sum approximation may be selectively enabled, e.g., to be used opportunistically as needed. For instance, a new flag or other indication may be used by the decoder 64 to inform the constraint node updating circuitry 65 whether the hybrid min-sum approximation is enabled.

Illustratively, when decoding a plurality of inputs that correspond to a particular output reliability value for a particular constraint node of a parity-check matrix, the decoder 64 may determine a particular decoding mode. Based on that decoding mode, then, the decoder 64 (constraint node updating circuitry 65) may then selectively apply at each constraint node one of either a modified min-sum approximation constraint node update or a hybrid min-sum approximation constraint node update.

For example, if the determined decoding mode is a normal read mode, the modified min-sum approximation may be applied, that is, e.g., with the modified reliability value resultant from the corresponding offset/normalized min-sum approximation. Particularly, if the normal read mode can decode LDPC codewords without the hybrid min-sum approximation described above, i.e., the number of zeros (lost signs) caused by reliability value modification are not critical to decoding to codeword. Conversely, the decoder 64 may encounter an inability to decode (converge/recover) the codeword using the offset/normalized min-sum approximation (e.g., where the modification declares too many erasures). This inability, along with other explicit error signals, such as erasure flags (e.g., where the read/write head 82 hits the media/disk 84), etc., may indicate that the decoder 64 should enter an error recovery mode, where the hybrid min-sum approximation described above may be applied in an attempt to recover the codeword. In other words, while in normal read mode, it may be acceptable to reduce/round the reliability values to zero and lose the associated sign information, so long as there are not too many lost signs (erasures) to reconstruct the codeword. However, once too many erasures have occurred (e.g., a burst), then it may be beneficial to replace those erasures with the unmodified min-sum approximation's low reliability values during error recovery/correction mode.

In addition to normal read mode and error recovery mode, a further decoding mode may be based on a length of the codeword. For example, with 512-byte sectors, the decoder may be run with the modified min-sum approximations (offset/normalized min-sum for increased performance), while the hybrid min-sum approximation (with increased erasure burst capability) may be used when in error recovery, as described above. However, for 1 KB sectors, the performance may be similar regardless of which approximation is used, thus the hybrid min-sum approximation may be used without consideration of normal versus error recovery modes (e.g., if performance is substantially similar, the benefits of the increased erasure burst correction may dictate use of the hybrid min-sum approximation as the only approximation option).

Figure 7:
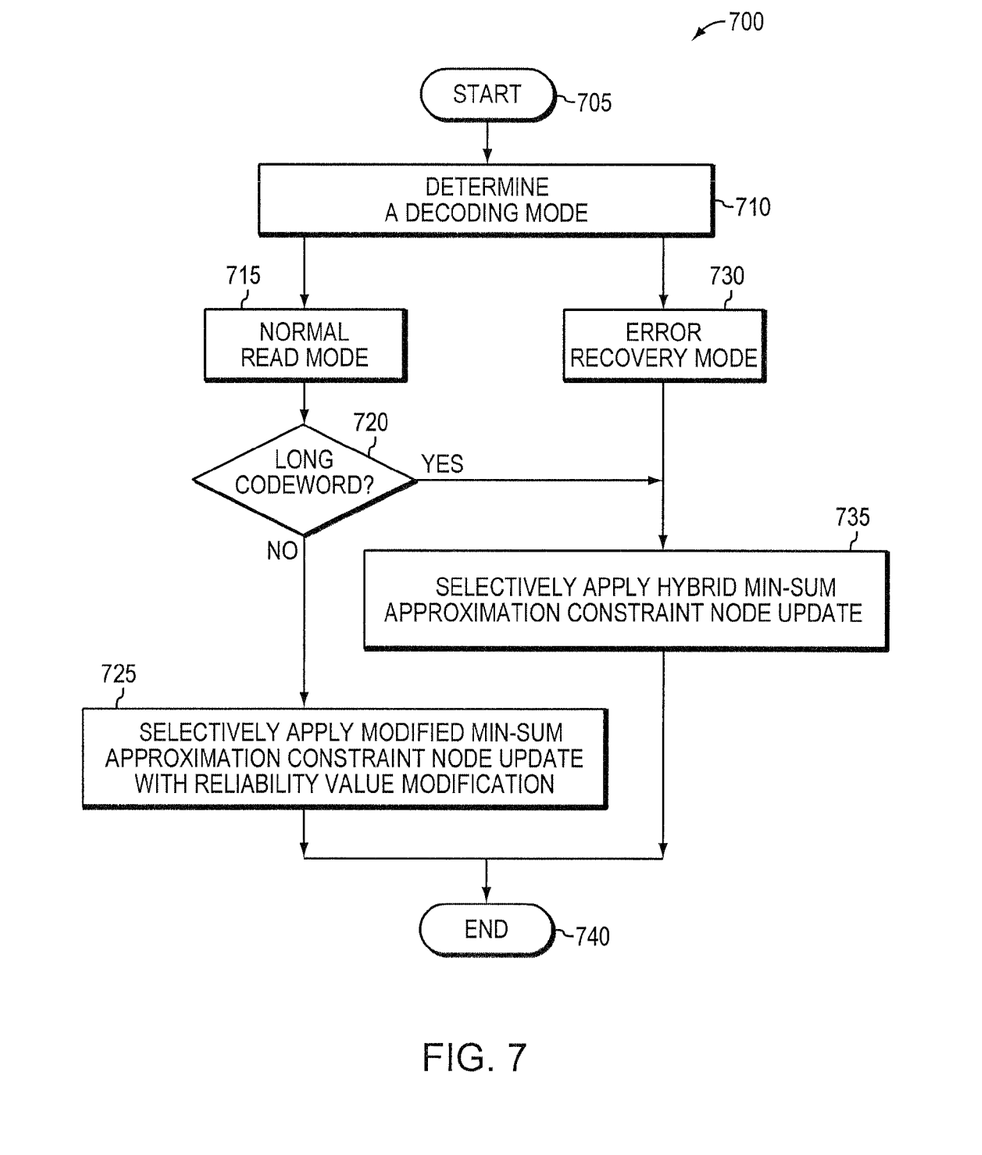

FIG. 7 illustrates another example procedure that provides for an efficient constraint node update for an LDPC decoder that both simplifies the decoder complexity and provides for sufficient burst erasure capability in accordance with one or more embodiments of the present invention. The procedure 700 starts at step 705, and continues to step 710, where the decoder 64 may determine a particular decoding mode, such as a normal read mode (715) or an error recovery mode (730). For instance, if it is determined that the decoder 64 is in normal read mode in step 715, it may also be determined whether the codeword is "long" in step 720, such as whether the codeword is a 1 KB codeword as opposed to a 512B codeword, as mentioned above. In step 725, if the decoder 64 is in normal read mode (step 715) or if the long codeword determination (step 720) is not an option, then the decoder 64 (constraint node update circuitry 65) may selectively apply a modified min-sum approximation constraint node update with reliability value modification, accordingly (e.g., for increased performance), such as the offset/normalized min-sum approximation (EQ3 and EQ4 above).

On the other hand, at step 710 the decoder 64 may determine that it is in error recovery mode (step 730), such as in response to an inability to recover/decode the codeword in normal read mode or an explicit indication (mentioned above), or from step 720 may determine that the codeword qualifies as a long codeword. If so, the decoder 64 may selectively apply the hybrid min-sum approximation (e.g., for increased burst erasure capability) in step 735, accordingly. In particular, in step 735, if in error recovery mode or if the codeword is long, the decoder 64 may apply the determination of step 610 and subsequent steps from FIG. 6 above for the hybrid min-sum approximation (EQ5). The procedure 700 ends in step 740, notably with the possibility of repeating for each decoding iteration performed by the decoder 64 (e.g., in case the decoding mode changes between/during iterations). Also, procedure 700 may further comprise processing the sign of the output reliability value and performing variable node updates as in steps 630 and 635 of FIG. 6 above (steps not show n in FIG. 7).

Advantageously, the novel techniques described herein provide for an efficient constraint node update for an LDPC decoder that both simplifies the decoder complexity and provides for sufficient burst erasure capability. By preventing declared erasures and loss of sign for low reliability input values, the novel techniques provide a constraint node update implementation that has improved SNR performance as compared to the conventional (unmodified) min-sum rule (EQ2), reduced implementation complexity similar to the normalized/offset (modified) min-sum rules (EQ3 and EQ4), and improved erasure burst capability as compared to the normalized/offset min-sum implementations. Further, the novel techniques provide an option of using the hybrid min-sum approximation during error recovery mode (optimized for detection/correction of erasure bursts), while using the modified min-sum approximation in a normal read (e.g., "on-the-fly") mode (optimized for detection/correction of random/dispersed errors).

While there has been shown and described illustrative embodiments that provide for an efficient constraint node update for an LDPC decoder that both simplifies the decoder complexity and provides for sufficient burst erasure capability, it is to be understood that various other adaptations and modifications may be made within the spirit and scope of the present invention. For example, the embodiments have been shown and described herein with/using normalized min-sum and offset min-sum approximations for the hybrid min-sum approximation above. However, the embodiments of the invention in its broader sense are not so limited, and may, in fact, be used with any min-sum type algorithm that uses some form of attenuation or offset compensation on the minimum reliability, such as the Lambda-min algorithm (where the lowest few reliability values are used), etc. Also, while the embodiments described above are directed toward preventing reduction to zero reliability (e.g., subtracting and offset, rounding down, etc.), the invention may also be used in a similar manner to prevent negative reliability values from being increased/rounded up to 0, such as where the sign is not separate from the reliability value. In particular, for any constraint node update, and for any use of reliability values, the key is to attenuate the reliability to the smallest non-zero value (M), but not reduce/increase that value further to zero (thus, preventing loss of sign).

Further, while the decoding mechanisms above been described within the context of a disk drive system, it will be appreciated that such decoding mechanisms may be used in other applications. For example, the data channel could be a communications channel and the decoding mechanisms could be employed by a network receiver that receives data packets over the communications channel. The decoding techniques above are also applicable to any LDPC decoder, whether that LDPC decoder is being used in a storage system application or some other type of application.

The foregoing description has been directed to specific embodiments of this invention. It will be apparent, however, that other variations and modifications may be made to the described embodiments, with the attainment of some or all of their advantages. For instance, it is expressly contemplated that the components and/or elements described herein can be implemented as software, including a computer-readable medium having program instructions executing on a computer, hardware, firmware, or a combination thereof. Accordingly this description is to be taken only by way of example and not to otherwise limit the scope of the invention. Therefore, it is the object of the appended claims to cover all such variations and modifications as come within the true spirit and scope of the invention.

What is claimed is:

1. A method, comprising:
   determining, with a decoder apparatus, whether a lowest reliability value of a plurality of inputs that correspond to a particular output reliability value for a particular constraint node of a parity-check matrix is greater than a threshold value; and if so,
   selectively applying a modified min-sum approximation constraint node update with a reliability value modification; and
   if the lowest input reliability value is less than or equal to the threshold value, performing an unmodified min-sum approximation constraint node update by setting the output reliability value as the lowest input reliability value.

2. The method of claim 1, wherein the modified min-sum approximation constraint node update is an offset min-sum approximation constraint node update, and wherein the threshold value is an offset value.

3. The method of claim 2, further comprising:
   performing the offset min-sum approximation constraint node update by setting the output reliability value as the lowest input reliability value less the offset value.

4. The method of claim 2, wherein the offset value is a single unit measure of reliability value.

5. The method of claim 1, wherein the modified min-sum approximation constraint node update is a normalized min-sum approximation constraint node update having a positive attenuation value, and wherein the threshold value is a lowest value that when multiplied by the attenuation value does not result in the output reliability value being rounded to zero.

6. The method of claim 5, further comprising:
   performing the normalized min-sum approximation constraint node update by setting the output reliability value as the lowest input reliability value multiplied by the attenuation value.

7. The method of claim 1, further comprising:
   preventing the modified min-sum approximation constraint node update from losing associated sign information for the output reliability value.

8. The method of claim 1, further comprising:
   processing a sign of the output reliability value based on signs associated with the input reliability values.

9. The method of claim 1, wherein the constraint node updates correspond to low density parity check (LDPC) decoding, the method further comprising:
   performing one or more variable node updates using the output reliability values from one or more corresponding constraint node updates based on the parity-check matrix.

10. An apparatus, comprising:
    a decoder configured to receive a codeword; and
    constraint node update circuitry of the decoder configured to selectively apply a modified min-sum approximation constraint node update with a reliability value modification in response to a lowest reliability value of a plurality of inputs that correspond to a particular output reliability value for a particular constraint node of a parity-check matrix being greater than a threshold value, the constraint node update circuitry further configured to perform an unmodified min-sum approximation constraint node update by setting the output reliability value as the lowest input reliability value in response to the lowest input reliability value being less than or equal to the threshold value.

11. The apparatus of claim 10, wherein the modified min-sum approximation constraint node update is an offset min-sum approximation constraint node update, and wherein the threshold value is an offset value, the constraint node update circuitry further configured to perform the offset min-sum approximation constraint node update by setting the output reliability value as the lowest input reliability value less the offset value.

12. The apparatus of claim 10, wherein the modified min-sum approximation constraint node update is a normalized min-sum approximation constraint node update having a positive attenuation value, and wherein the threshold value is a lowest value that when multiplied by the attenuation value does not result in the output reliability value being rounded to zero, the constraint node update circuitry further configured to perform the normalized min-sum approximation constraint node update by setting the output reliability value as the lowest input reliability value multiplied by the attenuation value.

13. The apparatus of claim 10, wherein the decoder is configured to operate in one of a plurality of decoding modes, the constraint node update circuitry further configured to selectively applying one of either the modified min-sum approximation constraint node update with a reliability value modification or an unmodified min-sum approximation constraint node update without a reliability value modification based on the decoding mode, regardless of the threshold value.

14. A method, comprising:
determining, with a decoder apparatus, a decoding mode when decoding a plurality of inputs that correspond to a particular output reliability value for a particular constraint node of a parity-check matrix; and
if the decoding mode is an error recovery mode; then
if a lowest input reliability value is less than or equal to a threshold value, applying an unmodified min-sum approximation constraint node update by setting an output reliability value as the lowest input reliability value; else
if a lowest input reliability value is greater than the threshold value, applying a modified min-sum approximation constraint node update by setting the output reliability value as the lowest input reliability value with a reliability value modification.

15. The method of claim 14, further comprising:
if the decoding mode is a normal read mode; then,
applying the modified min-sum approximation constraint node update with the reliability value modification.

16. The method of claim 14, further comprising:
determining that the error recovery mode exists in response to one of either an explicit error signal or an inability to decode the codeword using the modified min-sum approximation constraint node update with the reliability value modification.

17. The method of claim 14, further comprising:
determining the decoding mode based on a length of a codeword from which the inputs are derived.

18. An apparatus, comprising:
a decoder configured to receive a codeword; and
constraint node update circuitry of the decoder configured to determine an output reliability value for a particular constraint node of a parity-check matrix as a function of one or more input reliability values to the particular constraint node of the parity-check matrix, and to determine an output reliability correction offset as a function of the output reliability value.

19. The apparatus of claim 18 and wherein the constraint node update circuitry of the decoder is configured to determine the output reliability value for the particular constraint node of the parity-check matrix by applying an unmodified min-sum approximation constraint node update to the one or more input reliability values.

20. The apparatus of 19 and wherein the constraint node update circuitry of the decoder is further configured to compare the output reliability value for the particular constraint node of the parity-check matrix, determined by applying an unmodified min-sum approximation constraint node update to the one or more input reliability values, to a threshold value, and configured to apply the output reliability correction offset based on the comparison with the threshold value.

21. The apparatus of claim 18 and wherein the constraint node update corresponds to low density parity check (LDPC) decoding.

* * * * *